United States Patent
Suk et al.

(10) Patent No.: US 9,012,281 B2
(45) Date of Patent: Apr. 21, 2015

(54) SEMICONDUCTOR DEVICE FABRICATION METHODS

(71) Applicant: Samsung Electronics Co., Ltd., Suwon-si (KR)

(72) Inventors: Sung-Dae Suk, Seoul (KR); Hee-Soo Kang, Seoul (KR); Sung-Il Park, Suwon-si (KR); Sang-Hoon Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/829,703

(22) Filed: Mar. 14, 2013

(65) Prior Publication Data

US 2014/0225198 A1  Aug. 14, 2014

(30) Foreign Application Priority Data

Feb. 8, 2013  (KR) .......................... 10-2013-0014625

(51) Int. Cl.
*H01L 21/8238* (2006.01)
*H01L 27/092* (2006.01)

(52) U.S. Cl.
CPC .... *H01L 27/0922* (2013.01); *H01L 21/823871* (2013.01)

(58) Field of Classification Search
USPC ......... 257/197, 740, 238, 233, 300, 655, 682, 257/199, 561
See application file for complete search history.

(56) References Cited

U.S. PATENT DOCUMENTS

| | | | | |
|---|---|---|---|---|
| 5,912,188 | A * | 6/1999 | Gardner et al. ............... | 438/740 |
| 6,291,278 | B1 * | 9/2001 | Xiang et al. .................. | 438/197 |
| 7,064,025 | B1 | 6/2006 | Fang et al. | |
| 7,354,819 | B2 | 4/2008 | Nakajima et al. | |
| 7,662,716 | B2 * | 2/2010 | Kim et al. ...................... | 438/682 |
| 8,362,526 | B2 * | 1/2013 | Yang ............................. | 257/213 |
| 2006/0163670 | A1 | 7/2006 | Ellis-Monaghan et al. | |
| 2008/0023772 | A1 * | 1/2008 | Kawakita ...................... | 257/369 |
| 2008/0169515 | A1 * | 7/2008 | Hwang .......................... | 257/379 |
| 2008/0296696 | A1 * | 12/2008 | Yun et al. ...................... | 257/377 |
| 2011/0147855 | A1 | 6/2011 | Joshi et al. | |
| 2012/0074501 | A1 * | 3/2012 | Ellis-Monaghan et al. .. | 257/369 |

FOREIGN PATENT DOCUMENTS

| | | |
|---|---|---|
| JP | 2003-234416 | 8/2003 |
| JP | 2008-288329 | 11/2008 |
| JP | 2009-266999 | 11/2009 |
| KR | 1020050078104 A | 8/2005 |
| KR | 1020090116478 A | 11/2009 |

\* cited by examiner

*Primary Examiner* — Bilkis Jahan

(74) *Attorney, Agent, or Firm* — Myers Bigel Sibley & Sajovec, P.A.

(57) ABSTRACT

A semiconductor device includes a substrate having a first region and a second region, first and second gate electrodes disposed on the first and second regions, respectively, and first and second source/drain regions disposed on at least one side of the first and second gate electrodes, respectively. The device further includes first and second silicide regions in the first and second source/drain regions, respectively. A contact area between the first silicide region and the first source/drain region is differs in size from a contact area between the second silicide region and the second source/drain region. Methods of fabricating such devices are also provided.

4 Claims, 8 Drawing Sheets

SEMICONDUCTOR DEVICE FABRICATION METHODS

CROSS-REFERENCE TO RELATED APPLICATION

This application claims priority from Korean Patent Application No. 10-2013-0014625 filed on Feb. 8, 2013 in the Korean Intellectual Property Office, and all the benefits accruing therefrom under 35 U.S.C. 119, the contents of which in its entirety are herein incorporated by reference.

BACKGROUND

The present inventive subject matter relates to semiconductor devices and methods for fabricating the same.

The design rule of a semiconductor device is rapidly reduced as a semiconductor device is required to be highly integrated. Accordingly, semiconductor devices which consume low power and operate at high speed may be desired. In order to solve the problem of an increase in resistance caused by a smaller line width of a semiconductor device, surface resistance and contact resistance may be reduced by forming silicide region in a region in which a gate and a contact such as a source or a drain are formed. In order to further reduce resistance, different silicide regions may be formed in NMOS and PMOS regions of the semiconductor device.

SUMMARY

Some embodiments of the present inventive subject matter provide semiconductor devices and methods for fabricating the same that can reduce surface resistance or contact resistance of a source/drain region or and can simplify a silicide region forming process.

According to some embodiments of the present inventive subject matter, a semiconductor device includes a substrate having a first region and a second region, first and second gate electrodes disposed on the first and second regions, respectively, and first and second source/drain regions disposed on at least one side of the first and second gate electrodes, respectively. The device further includes first and second silicide regions in the first and second source/drain regions, respectively. A contact area between the first silicide region and the first source/drain region differs in size from a contact area between the second silicide region and the second source/drain region.

The first region may be a region in which a PMOS device is formed, and the second region may be a region in which an NMOS device is formed.

In some embodiments, a distance from a top surface of the substrate to a bottom surface of the second silicide region is greater than a distance from a top surface of the substrate to a bottom surface of the first silicide region. In some embodiments, a width of the second silicide region is greater than a width of the first silicide region. In further embodiments, the second silicide region may include a first metal and the first silicide region may include the first metal and a second metal different from the first metal.

The device may further include a first wiring line contacting the first silicide region and extending from a top surface of the first silicide region and a second wiring line contacting the second silicide region and extending from a top surface of the second silicide region. A length of the second wiring line may be greater than a length of the first wiring line.

The device may further include an etch stop layer disposed on the first and second source/drain regions.

Further embodiments provide methods of fabricating semiconductor devices. The methods include providing a substrate including a first region having a first gate electrode and a first source/drain region disposed adjacent the first gate electrode, and a second region having a second gate electrode and a second source/drain region disposed adjacent the second gate electrode, forming a first contact hole having a first depth in the first source/drain region, forming a first silicide region in the first contact hole, forming a second contact hole having a second depth different from the first depth in the second source/drain region, and forming a second silicide region in the second contact hole.

In some embodiments, forming the first contact hole may be preceded by forming an etch stop layer on source/drain regions of the first and second regions and forming an interlayer insulating film on the etch stop layer. Forming the first contact hole may include etching the interlayer insulating film until a top surface of the etch stop layer is exposed. Etching the interlayer insulating film until a top surface of the etch stop layer is exposed may include exposing a portion of the etch stop layer in the first region and forming the first contact hole may further include etching the exposed portion of the etch stop layer in the first region and an underlying portion of the source/drain region in the first region. In some embodiments, etching the interlayer insulating film until a top surface of the etch stop layer is exposed may include exposing a portion of the etch stop layer in the second region and the method may further include forming a third silicide region on the exposed portion of the etch stop layer in the second region concurrent with forming the first silicide region. For forming the second contact hole may include forming the second contact hole by removing the third silicide region and a portion of the etch stop layer in the second region.

In some embodiments, the second silicide region and the third silicide region may include different materials.

In some embodiments, forming the first contact hole may include forming a resist layer on the second region and etching the first source/drain region using the resist layer as a mask. In some embodiments, the second contact hole may be formed after forming the first silicide region, and forming the second contact hole may include etching the second source/drain region without using a resist layer on the first region while not etching a lower portion of the first contact hole. Forming the first contact hole may include forming a resist layer on the second region and the methods may further include removing the resist layer after forming the first contact hole.

Some embodiments of the present inventive subject matter provide a semiconductor device including a substrate, an NMOS transistor and a PMOS transistor disposed on the substrate and first and second silicide regions disposed at least partially in respective source/drain regions of the NMOS transistor and the PMOS transistor and having respective different areas of contact therewith. The first and second silicide regions may extend into the source/drain regions to different depths. The first and second silicide regions may have different widths. The second silicide region may include a first metal and the first silicide region may include the first metal and a second metal different from the first metal.

BRIEF DESCRIPTION OF THE DRAWINGS

The above and other features and advantages of the present inventive subject matter will become more apparent by describing in detail preferred embodiments thereof with reference to the attached drawings in which.

DETAILED DESCRIPTION

Figure 1:
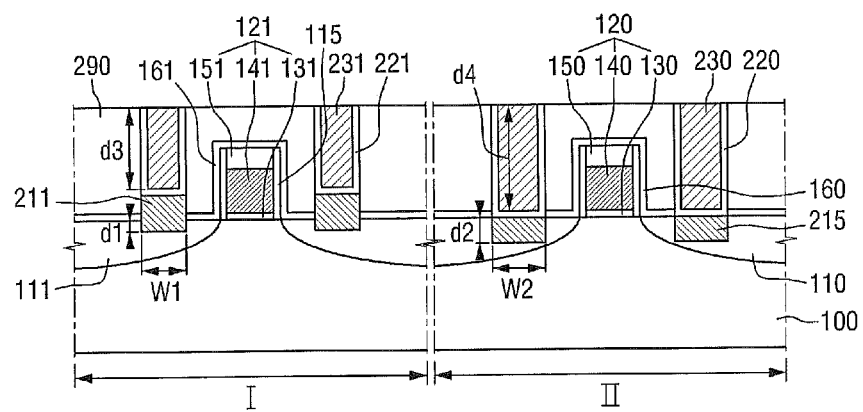
FIG. 1 is a cross-sectional view of a semiconductor device according to some embodiments of the present inventive subject matter.

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a semiconductor device according to first embodiments of the present inventive subject matter will be described with reference to FIG. 1.

FIG. 1 is a cross-sectional view of a semiconductor device according to first embodiments of the present inventive subject matter. Referring to FIG. 1, the semiconductor device according to the first embodiments of the present inventive subject matter includes a substrate 100, first and second gate electrodes 121 and 120, first and second source/drain regions 111 and 110, first and second silicide regions 211 and 215, an interlayer insulating film pattern 290, a capping layer pattern 220, and first and second wiring lines 231 and 230.

The substrate 100 may be a semiconductor substrate such as a silicon substrate, a silicon on insulator (SOI) substrate, a gallium arsenic substrate, or a silicon germanium substrate. The substrate 100 may include a first region I and a second region II. The first region I may be a PMOS region, and the second region II may be an NMOS, but embodiments of the present inventive subject matter are not limited thereto. The first region I may be an NMOS region, and the second region II may be a PMOS region.

A first gate electrode 121 is positioned on the first region I of the substrate 100, and a second gate electrode 120 is positioned on the second region II. A first source/drain region 111 may be positioned on at least one side of the first gate electrode 121, and a second source/drain region 110 may be positioned on at least one side of the second gate electrode 120. The first and second gate electrodes 121 and 120 may include gate insulation layer patterns 131 and 130, gate electrode structures 141 and 140, and gate mask layer patterns 151 and 150. The gate insulation layer patterns 131 and 130 may include, for example, silicon oxide, silicon nitride, SiON, GexOyNz, GexSiyOz, a high-k dielectric material, combinations thereof, or a stack of these materials sequentially stacked. Here, the high-k dielectric material may include, but not limited to, $HfO_2$, $ZrO_2$, $Al_2O_3$, $Ta_2O_5$, hafnium silicate, zirconium silicate, and combinations thereof.

The gate electrode structures 141 and 140 may include single layers made of poly-Si, poly-SiGe, impurity doped poly-Si, a metal such as Ta, TaN, TaSiN, TiN, Mo, Ru, Ni or NiSi, or metal silicide, or stacked layers of combinations of these materials, but embodiments of the present inventive subject matter are not limited thereto.

The gate mask layer patterns 151 and 150 may include, for example, silicon oxide or silicon nitride, but embodiments of the present inventive subject matter are not limited thereto. The gate electrode structures 141 and 140 may be protected by the gate mask layer patterns 151 and 150.

Spacers 115 may be formed on both sidewalls of the first and second gate electrodes 121 and 120. The spacers 115 may serve to protect the first and second gate electrodes 121 and 120 in a subsequent process of forming first and second wiring lines 231 and 230, which will later be described.

The first source/drain region 111 may be formed in the substrate 100 of at least one side of the first gate electrode 121, and the second source/drain region 110 may be formed in the substrate 100 of at least one side of the second gate electrode 120.

Etch stop layers 161 and 160 may be formed on portions on the first and second source/drain regions 111 and 110. In detail, the etch stop layers 161 and 160 may be formed between the first and second source/drain regions 111 and 110 and the interlayer insulating film pattern 290. The etch stop layers 161 and 160 may include, for example, silicon nitride, but embodiments of the present inventive subject matter are not limited thereto. The etch stop layers 161 and 160 may be conformally formed on the first source/drain region 111, sidewalls of the first gate electrode 121 and the first gate electrode 121 in the first region I and may be conformally formed on the second source/drain region 110, sidewalls of the second gate electrode 120 and a top surface of the second gate electrode 120 in the second region II. If the etch stop layers 161 and 160 are formed on the source/drain region 111 of the first region I, they may protect the substrate 100 in a process of etching an interlayer insulating film (291 of FIG. 3) to be described later.

The forming of the first and second gate electrodes 121 and 120 and the first and second source/drain regions 111 and 110 on the substrate 100 may be performed by processes well known in the art, and detailed descriptions thereof will be omitted.

A first silicide region 211 is formed at a portion in the first source/drain region 111, and a second silicide region 215 is formed at a portion in the second source/drain region 110. The first silicide region 211 includes a first metal and a second metal, and the second silicide region 215 includes the first metal. The first metal and the second metal are different from each other. The first and second silicide regions 211 and 215 reduce surface contact or contact resistance of the first and second source/drain regions 111 and 110. However, if the first silicide region 211 and the second silicide region 215 are formed of different materials, the extent of reducing the resistance may be differently determined according to characteristics of the NMOS region and the PMOS region, thereby improving the operating performance of the semiconductor device. In detail, the NMOS region preferably has low resistance in a highly integrated semiconductor device because current flows through electron movement in a channel formed under the gate electrode. However, the PMOS region needs to have a different characteristic from the NMOS region because current flows through hole movement in a channel formed under the gate electrode. For example, when the first region I is a PMOS region, the second metal included in the first silicide region 211 may be Pt, and when the second region II is an NMOS region, the first metal included in the second silicide region 215 may include Ti or Ni, but embodiments of the present inventive subject matter are not limited thereto.

Resistance characteristics of the semiconductor device may be controlled by forming the first and second silicide regions 211 and 215 using different materials and making the first and second silicide regions 211 and 215 have different contact areas with respect to the substrate 100. In detail, the contact area between the first silicide region 211 and the first source/drain region 111 may be different from the contact area between the second silicide region 215 and the second source/drain region 110. To make the first and second silicide regions 211 and 215 have different contact areas with respect to the substrate 100, a distance d2 from a top surface of the substrate 100 to a bottom surface of the second silicide region 215 may be made different from a distance d1 from the top surface of the substrate 100 to a bottom surface of the first silicide region 211. In addition, a width w1 of the first silicide region 211 may be made different from a width w2 of the second silicide region 215. For example, when the first region I is a PMOS region and the second region II is an NMOS region, the distance d2 from the top surface of the substrate 100 to the bottom surface of the second silicide region 215 may be greater than the distance d1 from the top surface of the substrate 100 to the bottom surface of the first silicide region 211, substrate 100, and the width w2 of the second silicide region 215 may be greater than the w1 of the first silicide region 211.

The materials forming the first silicide region 211 and the second silicide region 215, the widths of the first and second silicide regions 211 and 215, and the contact areas between the first and second silicide regions 211 and 215 and the substrate 100 may vary in various manners according to characteristics and uses of the semiconductor device, but embodiments of the present inventive subject matter are not limited thereto.

The capping layer pattern 220 may be conformally formed on both sidewalls of the interlayer insulating film pattern 290, the top surface of the first silicide region 211, both sidewalls of the interlayer insulating film pattern 290 and the top surface of the second silicide region 215. The capping layer pattern 220 may be formed of Ti, but embodiments of the present inventive subject matter are not limited thereto.

The first wiring line 231 to be electrically connected to the first source/drain region 111 may be formed on the first silicide region 211 to penetrate the interlayer insulating film pattern 290. The second wiring line 230 to be electrically connected to the second source/drain region 110 may be formed on the second silicide region 215 to penetrate the interlayer insulating film pattern 290. Here, the interlayer insulating film pattern 290 may include, for example, silicon oxide ($SiO_2$), but embodiments of the present inventive subject matter are not limited thereto. The first wiring line 231 and the second wiring line 230 may be made of, for example, tungsten (W), but embodiments of the present inventive subject matter are not limited thereto. The first wiring line 231 and the second wiring line 230 may be made of different materials.

A length d3 of the first wiring line 231 may be different from a length d4 of the second wiring line 230. In detail, since the first silicide region 211 including a first metal and a second metal is formed to have a thickness greater than that of the second silicide region 215 including the first metal in a subsequent process, the length d4 of the second wiring line 230 may be greater than the length d3 of the first wiring line 231.

Next, a semiconductor device according to second embodiments of the present inventive subject matter will be described with regard to FIG. 2. The following description will focus on differences between the first and second embodiments, and repeated descriptions will be omitted.

Figure 2:
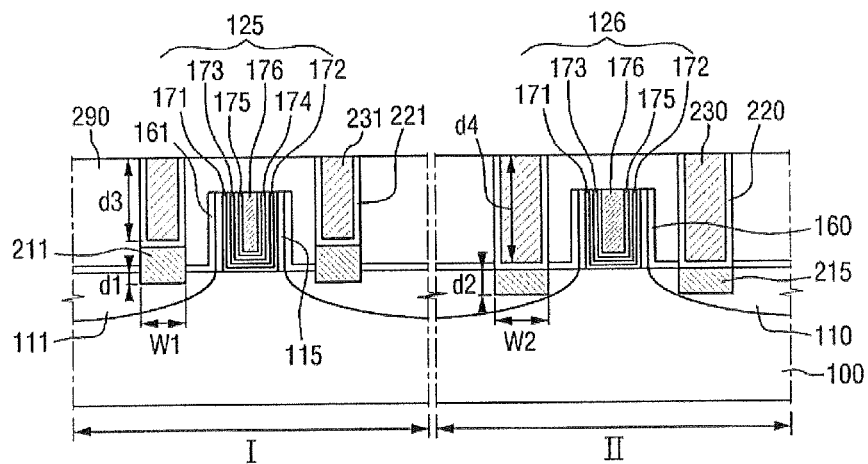
FIG. 2 is a cross-sectional view of a semiconductor device according to further embodiments of the present inventive subject matter.

FIG. 2 is a cross-sectional view of a semiconductor device according to second embodiments of the present inventive subject matter. Referring to FIG. 2, unlike in semiconductor device according to the first embodiments of the present inventive subject matter, in the semiconductor device according to the second embodiments of the present inventive subject matter, a gate electrode is formed by a gate last process. In detail, in a state in which a dummy gate (not shown) is formed, first and second source/drain regions 111 and 110 are formed. After the first and second source/drain regions 111 and 110 are formed, a third gate electrode 125 is formed on the first region I and a fourth gate electrode 126 is formed on the second region II. A first silicide region 211 and a second silicide region 215 are formed on portions in the first and second source/drain regions 111 and 110. The materials and shapes of the first silicide region 211 and the second silicide region 215 are substantially the same as those of the semiconductor device according to the first embodiments of the present inventive subject matter, and detailed descriptions thereof will be omitted.

The third gate electrode 125 may include a gate insulation layer 171, a capping layer 172, an etch stop layer 173, a work function control layer 174 of a first conductivity type, a work function control layer 175 of a second conductivity type, and a gate metal structure 176.

The gate insulation layer 171 may include silicon oxide, or a high-k dielectric material having a higher dielectric constant than silicon oxide. For example, the gate insulation layer 171 may include a material selected from the group consisting of HfSiON, HfO$_2$, ZrO$_2$, Ta$_2$O$_5$, TiO$_2$, SrTiO$_3$ and (Ba, Sr)TiO$_3$. The gate insulation layer 171 may be formed to an appropriate thickness according to the kind of device to be formed.

The capping layer 172 may be formed on the gate insulation layer 171. As shown, the capping layer 172 may be conformally on the gate insulation layer 171. The capping layer 172 may include, for example, TiN, but embodiments of the present inventive subject matter are not limited thereto.

The etch stop layer 173 may be formed on the capping layer 172. As shown, the etch stop layer 173 may be conformally on the capping layer 172. The etch stop layer 173 may include, for example, TaN, but embodiments of the present inventive subject matter are not limited thereto. Here, the etch stop layer 173 may be used in etching the first conductivity type work function control layer 174 unnecessarily formed on the second region II.

While FIG. 2 shows that the capping layer 172 and the etch stop layer 173 are separately formed from each other, the capping layer 172 and the etch stop layer 173 may be integrally formed as a single layer. In this case, the single layer may include at least one of TiN and TaN.

The first conductivity type work function control layer 174 may be formed on the etch stop layer 173. As shown, the work function control layer 174 may be conformally formed on the etch stop layer 173. The first conductivity type work function control layer 174 controls operating characteristics of a P-type transistor by controlling a work function of the transistor. The first conductivity type work function control layer 174 may include, for example, at least one of Mo, Pd, Ru, Pt, TiN, WN, TaN, Ir, TaC, RuN and MoN.

The second conductivity type work function control layer 175 may be formed on the first conductivity type work function control layer 174. The second conductivity type is different from the first conductivity type and may be, for example, an N type. The second conductivity type work function control layer 175 controls operating characteristics of an N-type transistor by controlling a work function of the transistor. The second conductivity type work function control layer 175 may include, for example, at least one of TiAl, and TiAlN. Even if the second conductivity type work function control layer 175 is formed on the first conductivity type work function control layer 174, the first conductivity type work function control layer 174 existing under the second conductivity type work function control layer 175 may affect the operating characteristic of the transistor, while the second conductivity type work function control layer 175 may not affect the operating characteristic of the transistor. Eventually, only the first conductivity type work function control layer 174 may control the operating characteristic of the transistor.

Figure 3:
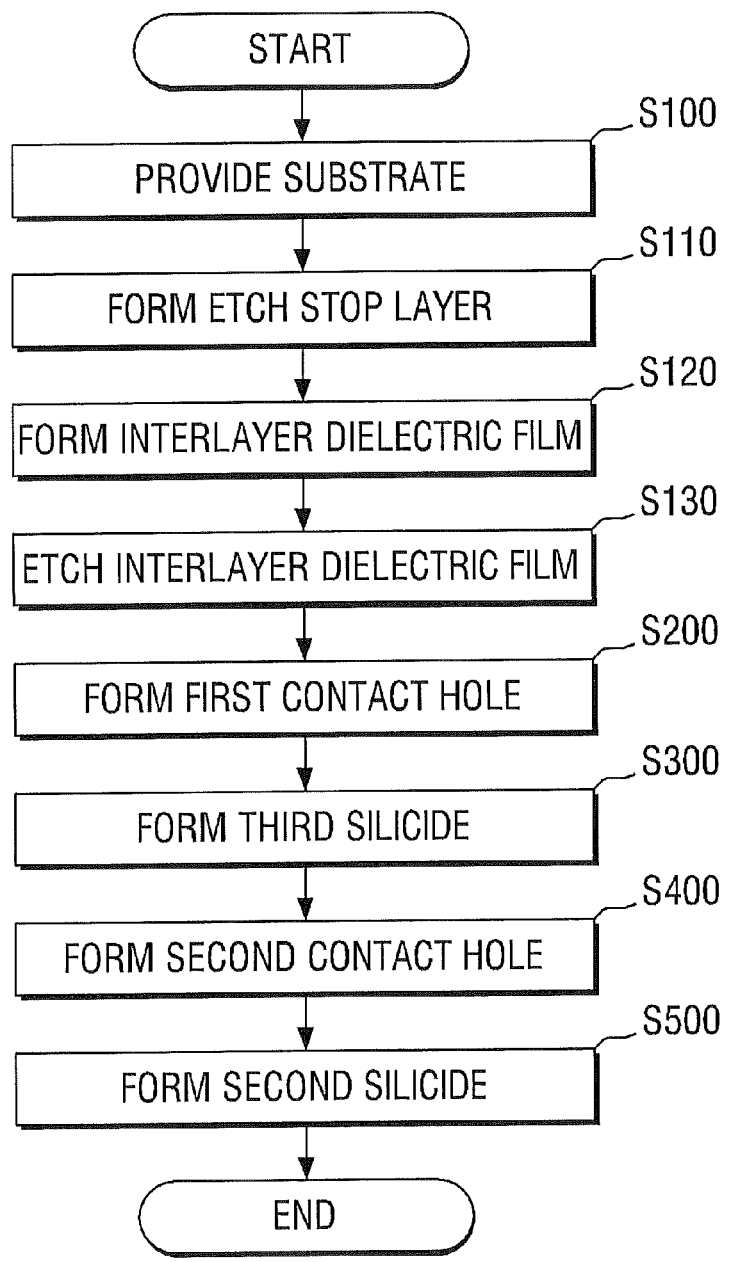
FIG. 3 is a flowchart of a method for fabricating the semiconductor device according to some embodiments of the present inventive subject matter.

While FIG. 3 shows that the gate electrode 125 includes both of the first and second conductivity type work function control layers 174 and 175, the gate electrode 125 may include only the first conductivity type work function control layer 174.

The gate metal structure 176 may be formed on the second conductivity type work function control layer 174. The gate metal structure 176 may include, for example, Al and W, but embodiments of the present inventive subject matter are not limited thereto.

The fourth gate electrode 126 of the second region II may include a gate insulation layer 171, a capping layer 172, an etch stop layer 173, a second conductivity type work function control layer 175 and a gate metal structure 176. Unlike the third gate electrode 125, the fourth gate electrode 126 does not include the first conductivity type work function control layer 175. Therefore, the fourth gate electrode 126 may operate with characteristics of an N-type transistor. The fourth gate electrode 126 is substantially the same as the third gate electrode 125, except that it does not include the first conductivity type work function control layer 134, and a detailed description thereof will be omitted.

In the semiconductor device according to the second embodiments of the present inventive subject matter, the third and fourth gate electrodes 125 and 126 are formed in a different order from that in the semiconductor device according to the first embodiments of the present inventive subject matter. Thus, the etch stop layers 161 and 160 may not be formed on the third and fourth gate electrodes 125 and 126. In detail, the third and fourth gate electrodes 125 and 126 are formed by forming a dummy gate (not shown), forming the etch stop layers 161 and 160 to cover the substrate 100 and the dummy gate, and exposing the dummy gate. When the dummy gate is exposed, the etch stop layers 161 and 160 covering the dummy gate are removed. After forming the third and fourth gate electrodes 125 and 126, the etch stop layers 161 and 160 are not formed again on top surfaces of the third and fourth gate electrodes 125 and 126, they may not be present on the top surfaces of the third and fourth gate electrodes 125 and 126.

Hereinafter, operations for fabricating the semiconductor device according to the first embodiments of the present inventive subject matter will be described with reference to FIGS. 3 to 10. FIG. 3 is a flowchart of a method for fabricating the semiconductor device according to the first embodiments of the present inventive subject matter, and FIGS. 4 to 10 are views illustrating intermediate process steps of the method for fabricating the semiconductor device according to the first embodiments of the present inventive subject matter.

Referring to FIG. 3, a substrate is first provided (S100). In detail, referring to FIG. 4, the substrate having a first region I and a second region II is provided, the first region I having a first gate electrode 121 and a first source/drain region 111 positioned on at least one side of the first gate electrode 121, and the second region II formed in the same shape as the first region II and having a second gate electrode 120 and a second source/drain region 110.

Figure 4:
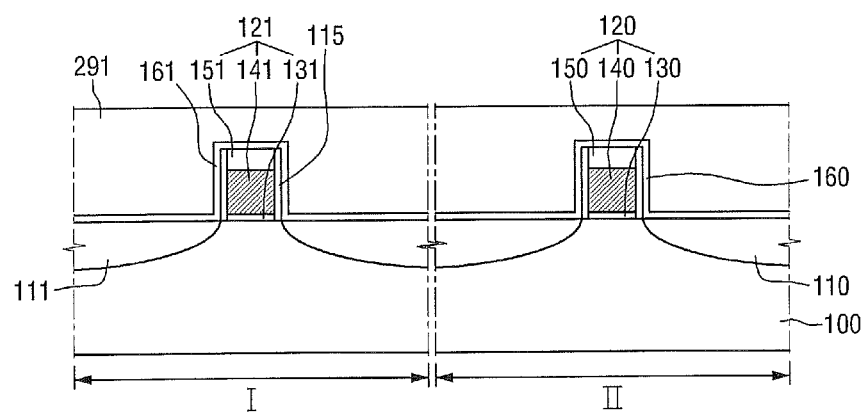
FIGS. 4 to 10 are views illustrating fabrication products and operations for fabrication thereof according to some embodiments of the present inventive subject matter.
Figure 5:
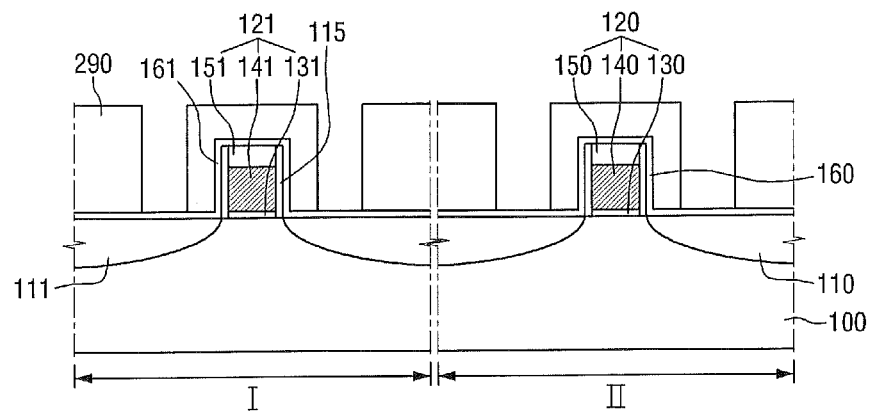

Referring again to FIGS. 3 and 4, an interlayer insulating film 291 entirely covering the substrate 100 and the first and second gate electrode 121 and 120 is formed (S120). After providing the substrate 100 and before forming the interlayer insulating film 291, etch stop layers 161 and 160 may be formed on the first and second source/drain regions 111 and 110 (S110). That is to say, the etch stop layers 161 and 160 may be formed between the substrate 100 and the interlayer insulating film 291. As shown in FIG. 4, the etch stop layers 161 and 160 may be conformally formed along sidewalls and top surfaces of the first and second gate electrode 121 and 120, but embodiments of the present inventive subject matter are not limited thereto. The etch stop layers 161 and 160 may be formed only on the first and second source/drain regions 111 and 110, without being formed on the sidewalls and top surfaces of the first and second gate electrode 121 and 120. The etch stop layers 161 and 160 may include, for example, SiN, but embodiments of the present inventive subject matter are not limited thereto. When the etch stop layers 161 and 160 are formed, it is possible to prevent the substrate 100 from being etched before forming first and second contact holes (181 of FIGS. 5 and 180 of FIG. 7) to be described later. Therefore, the substrate 100 can be accurately etched to a desired depth when the first and second source/drain regions 111 and 110 are later etched while protecting the substrate 100.

Still referring to FIG. 3, the interlayer insulating film 291 is etched (S130). In detail, referring to FIGS. 4 and 5, the interlayer insulating film 291 is etched to expose portions of the first source/drain region 111 and the second source/drain region 110. When the interlayer insulating film 291 is etched, the first region I and the second region II are etched with different widths. If the etching widths of the first region I and the second region II are different, widths of the first and second silicide regions (211 and 215) may be made different from each other. The interlayer insulating film pattern 290 is formed by etching the interlayer insulating film 291.

In a case where the etch stop layers 161 and 160 are formed on the first and second source/drain regions 111 and 110, the interlayer insulating film 291 is etched until the etch stop layers 161 and 160 are exposed.

Figure 6:
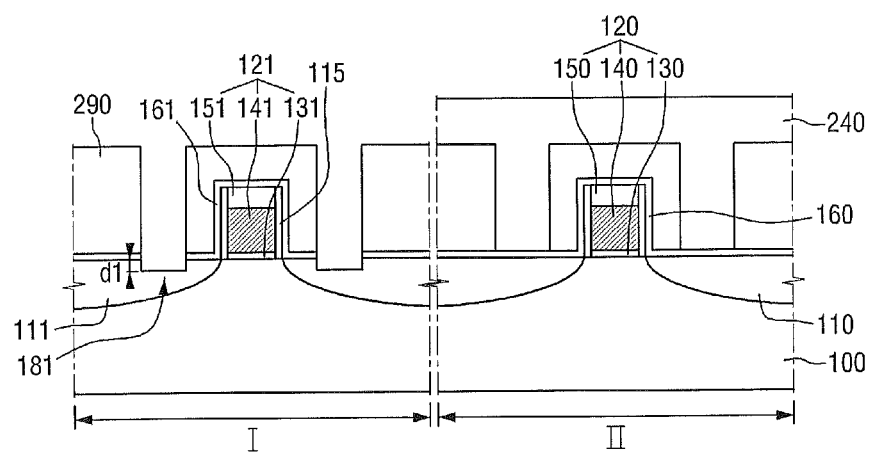

Next, referring again to FIG. 3, a first contact hole 181 is formed (S200). Referring to FIG. 6, a portion of the first source/drain region 111 of the first region I is etched to form the first contact hole 181. In detail, a resist layer 240 is covered on the second region II. The exposed first source/drain region 111 is etched to form the first contact hole 181 in the first source/drain region 111. The first contact hole 181 may be formed by at least one of dry etching and wet etching. Here, only the exposed first source/drain region 111 is etched while the interlayer insulating film pattern 290 is not etched. The first contact hole 181 is formed in the first source/drain region 111 to a first depth d1 from the top surface of the substrate 100.

In a case where the etch stop layer 161 is formed on the first source/drain region 111, the etch stop layer 161 exposed in the first region I is also etched while the portion of the first source/drain region 111 is etched.

Figure 7:
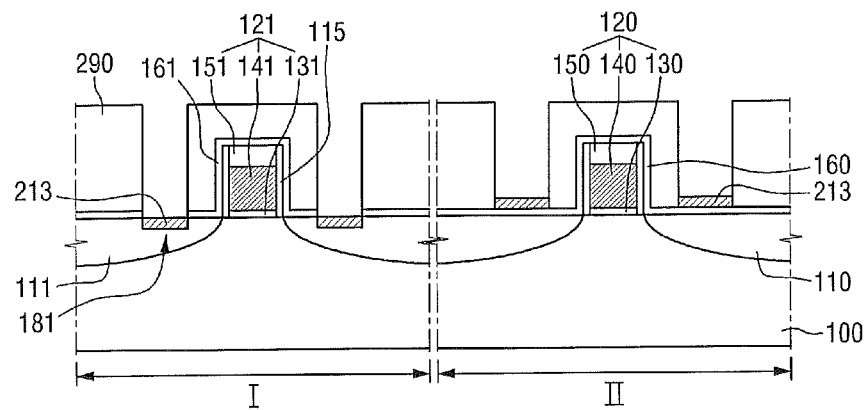

Referring again to FIG. 3, a third silicide region 213 is formed in the first contact hole 181 (S300). Referring to FIG. 7, the third silicide region 213 includes a second metal, and is formed by depositing the second metal in the first contact hole 181. The second metal may be deposited in the first contact hole 181 by, for example, chemical vapor deposition (CVD), atomic layer deposition (ALD), or physical vapor deposition (PVD), but embodiments of the present inventive subject matter are not limited thereto.

Here, in a state in which the second region II is covered by the resist layer 240, the third silicide region 213 may be formed. Alternatively, in a state in which the resist layer 240 is removed, the third silicide region 213 may be formed. In the latter case, since the second metal fills an etched portion of the interlayer insulating film pattern 290 of the second region II, the third silicide region 213 may also be formed on the second region II, but the third silicide region 213 of the second region II is removed in a subsequent process. Thus, when the third silicide region 213 is formed on the first region I, it does not matter whether the third silicide region 213 is formed on the second region II or not.

After the third silicide region 213 is formed in the first contact hole 181, heat may be applied to the third silicide region 213. If heat is applied to the third silicide region 213, the third silicide region 213 may be mixed with a material forming the first source/drain region 111.

Figure 8:
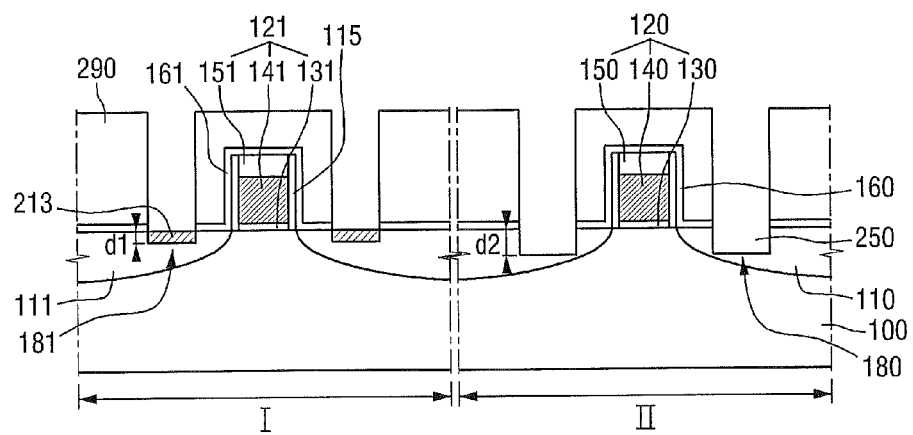

Referring again to FIG. 3, a second contact hole 180 is formed (S400). Referring to FIG. 8, the second contact hole 180 is formed by etching a portion of the second source/drain region 110 of the second region II. In a case of forming the second contact hole 180, the first region I is not covered by the resist layer 240, unlike in a case of forming the first contact hole 181. In a state where the first region I is not covered by the resist layer 240, the second contact hole 180 is formed by etching a portion of the second source/drain region 110 of the second region II. Even if the first region I is not covered by the resist layer 240, the first source/drain region 111 is not etched by the third silicide region 213. In addition, since the third silicide region 213 is mixed with the material forming the first source/drain region 111, it is not etched, and even if it is, only a portion of the third silicide region 213 may be etched. The forming of the second contact hole 180 may be performed by at least one of dry etching or wet etching, like in the forming of the first contact hole 181. In addition, the interlayer insulating film pattern 290 is not etched while only the exposed second source/drain region 110 is etched. The second contact hole 180 is formed in the second source/drain region 110 to a second depth d2 from the top surface of the substrate 100. The second depth d2 may be different from the first depth d1. The second depth d2 may be adjusted according to the characteristics and use of semiconductor device. For example, the second depth d2 may be greater than the first depth d1, but embodiments of the present inventive subject matter are not limited thereto.

When an etch stop layer 160 is formed on the second source/drain region 110, the exposed etch stop layer 160 in the second region II is also etched when the portion of the second source/drain region 110 is etched.

Figure 9:
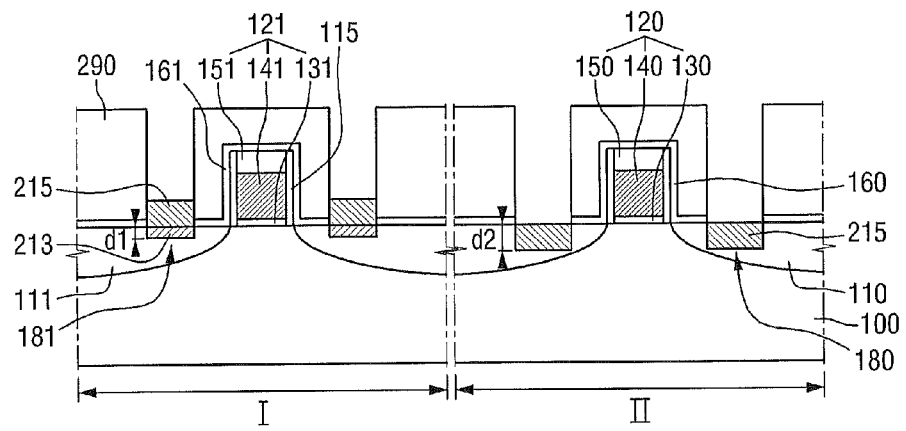

Referring again to FIG. 3, a second silicide region 215 is formed (S500). Referring to FIG. 9, the second silicide region 215 includes a first metal different from the second metal and is formed by deposing the first metal in the second contact hole 180. The deposing of the first metal in the second contact hole 180 may be performed by, for example, chemical vapor deposition (CVD), atomic layer deposition (ALD), or physical vapor deposition (PVD), but embodiments of the present inventive subject matter are not limited thereto.

If a resist layer is not used in forming the second silicide region 215 on the second region II, the second silicide region 215 may also be formed on the third silicide region 213 of the first region I. That is to say, the third silicide region 213 and the second silicide region 215 may be formed on the first region I. Even if both of the second silicide region 215 and the third silicide region 213 exist on the first region I, it is possible to adjust resistance characteristics of the first source/drain region 111 due to the second metal included in the third silicide region 213.

In the above-described operations for fabricating a semiconductor device according to the first embodiments of the present inventive subject matter, a resist layer (240 of FIG. 6) is used only once to form different silicide regions on the first source/drain region 111 and the second source/drain region 110, thereby potentially simplifying the fabricating process and reducing the fabrication cost of the semiconductor device.

Figure 10:
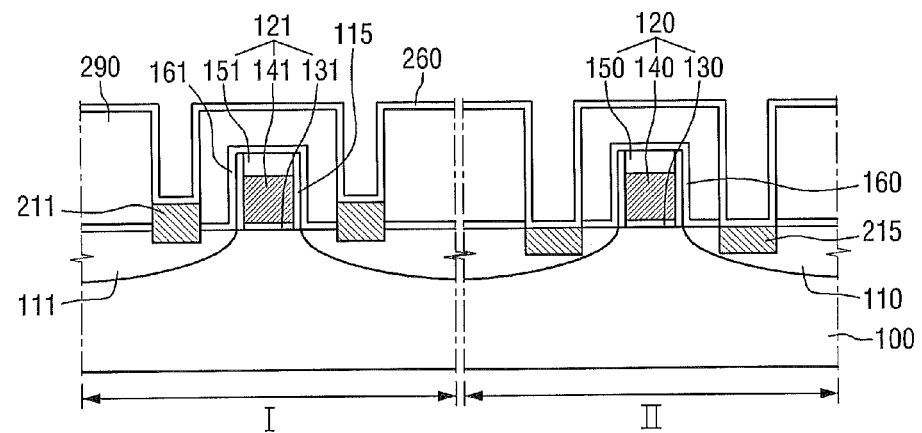

Referring to FIG. 10, the substrate 100 is annealed. If the annealing is finished, the third silicide region 213 and the second silicide region 215 on the first source/drain region 111 may be mixed to become the first silicide region 211 including the first metal and the second metal. Since the first silicide region 211 is formed by combining the third silicide region 213 with the second silicide region 215, a thickness of the first silicide region 211 may be greater than that of the second silicide region 215 of the second region II.

Even after the annealing is performed, the third silicide region (213 of FIG. 9) and the second silicide region 215 may not be mixed with each other. In this case, the third silicide region (213 of FIG. 9) and the second silicide region 215 may exist in a stacked manner, and the first silicide region 211 may be a stack of the third silicide region (213 of FIG. 9) and the second silicide region 215.

Subsequently, a capping layer 260 may be conformally formed along top and lateral surfaces of the interlayer insulating film pattern 290, a top surface of the first silicide region 211, top and lateral surfaces of the interlayer insulating film pattern 290 and a top surface of the second silicide region 215. The capping layer 260 may be formed by, for example, sputtering.

Referring back to FIG. 1, a first wiring line 231 is formed on the first silicide region 211, and a second wiring line 230 is formed on the second silicide region 215. As described above, the first wiring line 231 and the second wiring line 230 may have different lengths due to a thickness difference between the first silicide region 211 and the second silicide region 215. In detail, a length d3 of the first silicide region 211 may be greater than a length d4 of the second silicide region 215.

A top portion of the semiconductor device is polished by chemical mechanical polishing (CMP) to expose the interlayer insulating film pattern 290, thereby completing the semiconductor device shown in FIG. 1.

Figure 11:
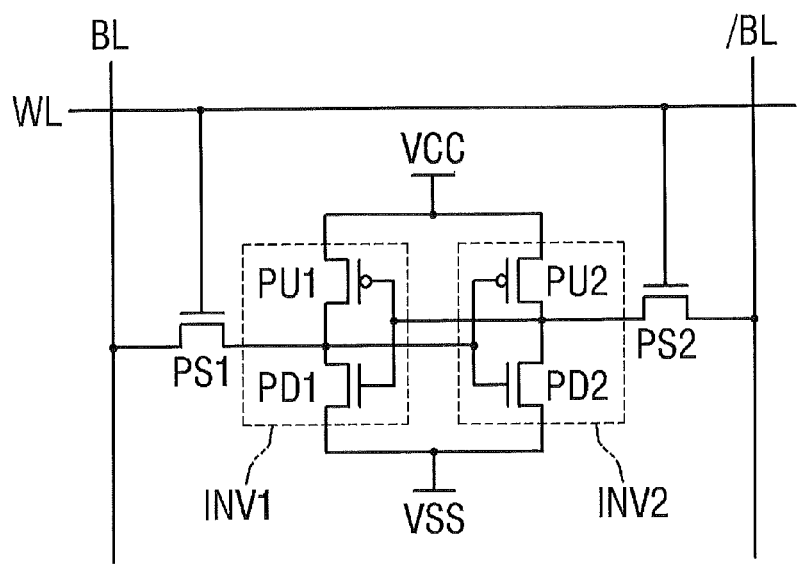
FIGS. 11 and 12 are a circuit view and a layout view for illustrating a semiconductor device according to yet further embodiments of the present inventive subject matter.
Figure 12:
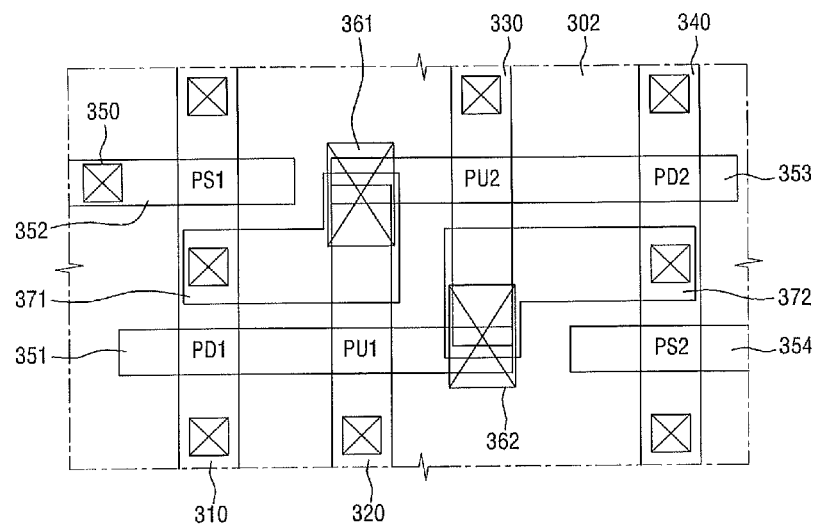

FIGS. 11 and 12 are a circuit view and a layout view for illustrating a semiconductor device according to third embodiments of the present inventive subject matter.

Referring to FIGS. 11 and 12, the semiconductor device according to the third embodiments of the present inventive subject matter may include a pair of inverters INV1 and INV2 connected in parallel between a power supply node Vcc and a ground node Vss, and a first pass transistor PS1 and a second pass transistor PS2 connected to output nodes of the respective inverters INV1 and INV2. The first pass transistor PS1 and the second pass transistor PS2 may be connected to a bit line BL and a complementary bit line BL/, respectively. Gates of the first pass transistor PS1 and the second pass transistor PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PMOS transistors, and the first pull-down transistor PD1 and the second pull-down transistor PD2 may be NMOS transistors.

In addition, in order to constitute a latch circuit, an input port of the first inverter INV1 is connected to the output port of the second inverter INV2, and an input port of the second inverter INV2 is connected to the output port of the first inverter INV1.

Referring to FIGS. 11 and 12, a first active region 310, a second active region 320, a third active region 330, and a fourth active region 340, which are spaced apart from each other, are formed to elongate in a direction (e.g., in an up-and-down direction of FIG. 11). The second active region 320 and the third active region 330 extend in shorter lengths than the first active region 310 and the fourth active region 340.

In addition, a first gate electrode 351, a second gate electrode 352, a third gate electrode 353, and a fourth gate electrode 354 are formed to elongate in the other direction (e.g., in a left-and-right direction of FIG. 11) to cross the first active region 310 through the fourth active region 340. In detail, the first gate electrode 351 may completely cross the first active region 310 and the second active region 320 and may partially overlap a terminal part of the third active region 330. The third gate electrode 353 may completely cross the fourth active region 340 and the third active region 330 and may partially overlap a terminal part of the second active region 320. The second gate electrode 352 and the fourth gate electrode 354 are formed to cross the first active region 310 and the fourth active region 340, respectively.

As shown, the first pull-up transistor PU1 is defined around an intersection of the first gate electrode 351 and the second active region 320, the first pull-down transistor PD1 is defined around an intersection of the first gate electrode 351 and the first active region 310, and the first pass transistor PS1 is defined around an intersection of the second gate electrode 352 and the first active region 310. The second pull-up transistor PU2 is defined around an intersection of the third gate electrode 353 and the third active region 330, the second pull-down transistor PD2 is defined around an intersection of the third gate electrode 353 and the fourth active region 340, and the second pass transistor PS2 is defined around an intersection of the fourth gate electrode 354 and the fourth active region 340. Source/drain regions may be formed at both sides of the intersections of the first to fourth gate electrodes 351 to 354 and the first to fourth active regions 310, 320, 330 and 340.

In addition, a plurality of contacts 350 may be formed. A shared contact 361 connects the second active region 320, the third gate line 353 and a wiring line 371. A shared contact 362 concurrently connects the third active region 330, the first gate line 351, and a wiring line 372.

For example, the first pull-up transistor PU1 and the second pull-up transistor PU2 may have the configurations described above with regard to the first region I of FIG. 1, and the first pull-down transistor PD1, the first pass transistor PS1, the second pull-down transistor PD2, and the second pass transistor PS2 may have the configurations described above with regard to the second region II of FIG. 1.

Figure 13:
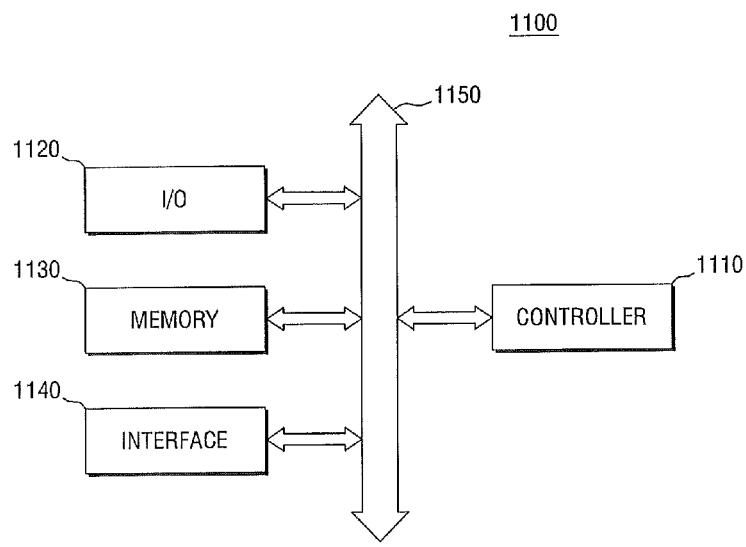
FIG. 13 is a block diagram of an electronic system including semiconductor memory devices according to some embodiments of the present inventive subject matter.

FIG. 13 is a block diagram of an electronic system including semiconductor memory devices according to the embodiments of the present inventive subject matter. Referring to FIG. 13, the electronic system 1100 according to the embodiments of the present inventive subject matter may include a controller 1110, an input and output (I/O) device 1120, a memory device 1130, an interface 1140, and a bus 1150. The controller 1110, the I/O device 1120, the memory device 1130, and the interface 1140 may be coupled to each other via the bus 1150. The bus 1150 is a transfer pathway of data.

The controller 1110 may include at least one microprocessor, digital signal processor, and/or microcontroller, and at least one logic device that can execute functions similar to these. The I/O device 1120 may include a keypad, a keyboard, and a display device. The memory device 1130 may store data and/or instructions. The interface 1140 transmits data to a communication network or receives data from a communication network. The interface 1140 may have a wired or wireless form. For example, the interface 1140 may include an antenna or a wire/wireless transceiver. Although not illustrated in FIG. 13, the electric system 1100 and an operation memory for improving the operation of the controller 1110 may further include high-speed DRAM and/or SRAM.

The fin type field effect transistor according to embodiments of the present inventive subject matter may be incorporated into the memory device 1130 or may be provided as a part of the controller 1110 or the I/O device 1120.

The electronic system 1100 is applicable to a mobile system, a personal computer, an industrial computer, or a system carrying out various functions. For example, the mobile system may be a personal digital assistant (PDA), a portable computer, a web tablet, a wireless phone, a mobile phone, a digital music player, a memory card, or electronic products for transmitting/receiving information in wireless environments.

Figure 14:
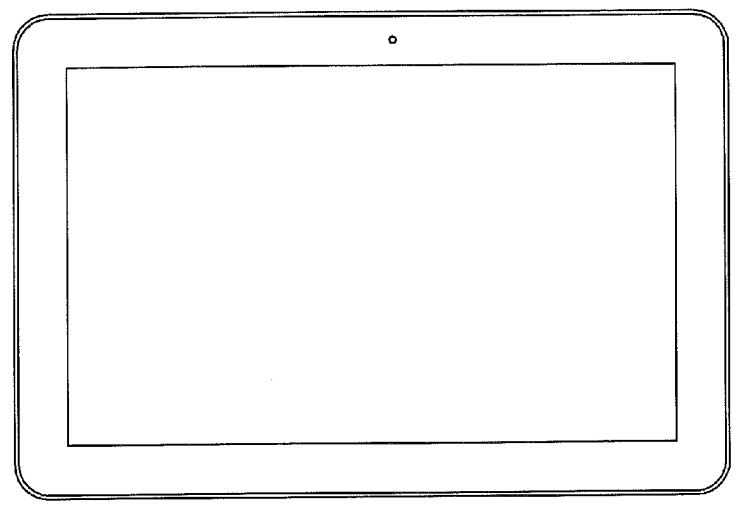
FIGS. 14 and 15 illustrate exemplary semiconductor systems in which semiconductor devices according to some embodiments of the present inventive subject matter can be applied.
Figure 15:
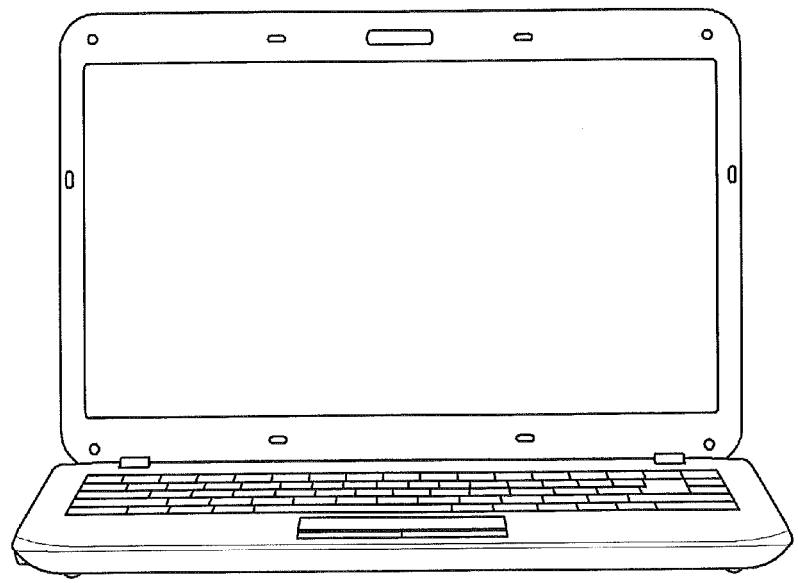

FIGS. 14 and 15 illustrate exemplary semiconductor systems to which the semiconductor device according to some embodiments of the present inventive subject matter can be applied. Specifically, FIG. 14 illustrates a tablet PC and FIG. 15 illustrates a notebook computer. At least one of the semiconductor devices according to some embodiments of the present inventive subject matter can be applied to the tablet PC, a notebook computer, or the like. It is obvious to one skilled in the art that at least one of the semiconductor devices according to some embodiments of the present inventive subject matter can be applied to other integrated circuit devices not illustrated herein.

While the present inventive subject matter has been particularly shown and described with reference to exemplary embodiments thereof, it will be understood by those of ordinary skill in the art that various changes in form and details may be made therein without departing from the spirit and scope of the present inventive subject matter as defined by the following claims. It is therefore desired that the present embodiments be considered in all respects as illustrative and not restrictive, reference being made to the appended claims rather than the foregoing description to indicate the scope of the inventive subject matter.

What is claimed is:

1. A method of fabricating a semiconductor device, the method comprising:
    providing a substrate including a first region having a first gate electrode and a first source/drain region disposed adjacent the first gate electrode, and a second region having a second gate electrode and a second source/drain region disposed adjacent the second gate electrode;
    forming an etch stop layer on the first and second source/drain regions of the first and second regions;
    forming an interlayer insulating film on the etch stop layer;
    etching the interlayer insulating film to expose portions of the etch stop layer in the first and second regions;
    forming a resist layer on the second region;
    etching the etch stop layer and an underlying portion of the first source/drain region in the first region using the resist layer as a mask to form a first contact hole having a first depth in the first source/drain region;
    concurrently forming a first silicide region in the first contact hole and a sacrificial silicide region on the etch stop layer in the second region;
    forming a second contact hole having a second depth different from the first depth in the second source/drain region by removing the sacrificial silicide region, a portion of the etch stop layer, and an underlying portion of the first source/drain region in the second region; and
    forming a second silicide region in the second contact hole.

2. The method of claim 1, wherein the second silicide region and the third silicide region include different materials.

3. The method of claim 1, wherein the second contact hole is formed after forming the first silicide region, and wherein forming the second contact hole comprises etching the second source/drain region without using a resist layer on the first region while not etching a lower portion of the first contact hole.

4. The method of claim 1, wherein the method further comprises removing the resist layer after forming the first contact hole.

* * * * *